US009705522B1

(12) United States Patent
Ng et al.

(10) Patent No.: US 9,705,522 B1
(45) Date of Patent: Jul. 11, 2017

(54) HIGH SPEED LOW POWER DIGITAL TO ANALOG UPCONVERTER

(71) Applicant: The Boeing Company, Chicago, IL (US)

(72) Inventors: Vincent T. Ng, San Marino, CA (US); Sharon S. Ng, Alhambra, CA (US); Shihchang Wu, Rancho Palos Verdes, CA (US); Pedro A. Martinez, Hawthorne, CA (US); Nhung T. Araki, Redondo Beach, CA (US)

(73) Assignee: The Boeing Company, Chicago, IL (US)

(*) Notice: Subject to any disclaimer, the term of this patent is extended or adjusted under 35 U.S.C. 154(b) by 0 days.

(21) Appl. No.: 15/344,328

(22) Filed: Nov. 4, 2016

(51) Int. Cl.
*H03M 1/66* (2006.01)
*H03M 1/10* (2006.01)
*H03D 7/12* (2006.01)

(52) U.S. Cl.
CPC .............. *H03M 1/10* (2013.01); *H03D 7/125* (2013.01); *H03M 1/66* (2013.01); *H03M 1/662* (2013.01)

(58) Field of Classification Search
CPC .......... H03M 1/10; H03M 1/66; H03M 1/662; H03D 7/125
USPC .................................................. 341/144, 120
See application file for complete search history.

(56) References Cited

U.S. PATENT DOCUMENTS

| | | | | |
|---|---|---|---|---|
| 6,567,132 B1* | 5/2003 | Groff | ........................ | H04J 1/06 348/469 |
| 6,690,313 B1* | 2/2004 | Warren | .................. | H03M 1/687 341/141 |
| 6,985,705 B2* | 1/2006 | Shohara | ..................... | H03J 7/04 331/1 R |
| 7,528,754 B1* | 5/2009 | Bakkaloglu | ........... | H03M 3/504 341/136 |
| 7,702,034 B1* | 4/2010 | Haddadin | ............... | H04L 27/36 332/103 |
| 8,111,183 B2* | 2/2012 | Gomez | .................. | H03D 7/161 341/144 |
| 8,223,824 B2* | 7/2012 | Kim | ..................... | H04L 12/2801 375/219 |

* cited by examiner

*Primary Examiner* — Brian Young
(74) *Attorney, Agent, or Firm* — Haynes and Boone, LLP

(57) ABSTRACT

Systems and methods according to one or more embodiments are provided for a high speed digital to analog upconverter that provides for converting a plurality of parallel digital data bits to an analog output signal. In one example, a system includes a decoder circuit configured to receive a plurality of decoder input data bits and provide a plurality of decoded parallel digital data bits. The system also includes a mixer circuit configured to combine each of the decoded parallel digital data bits with a conversion clock signal to provide frequency shifted digital data bits, wherein the frequency shifted digital data bits are time misaligned with each other. The system also includes a synchronizer circuit configured to time align the frequency shifted digital data bits. The system further includes a switching network configured to generate an analog output signal in response to the time aligned frequency shifted digital data bits.

18 Claims, 13 Drawing Sheets

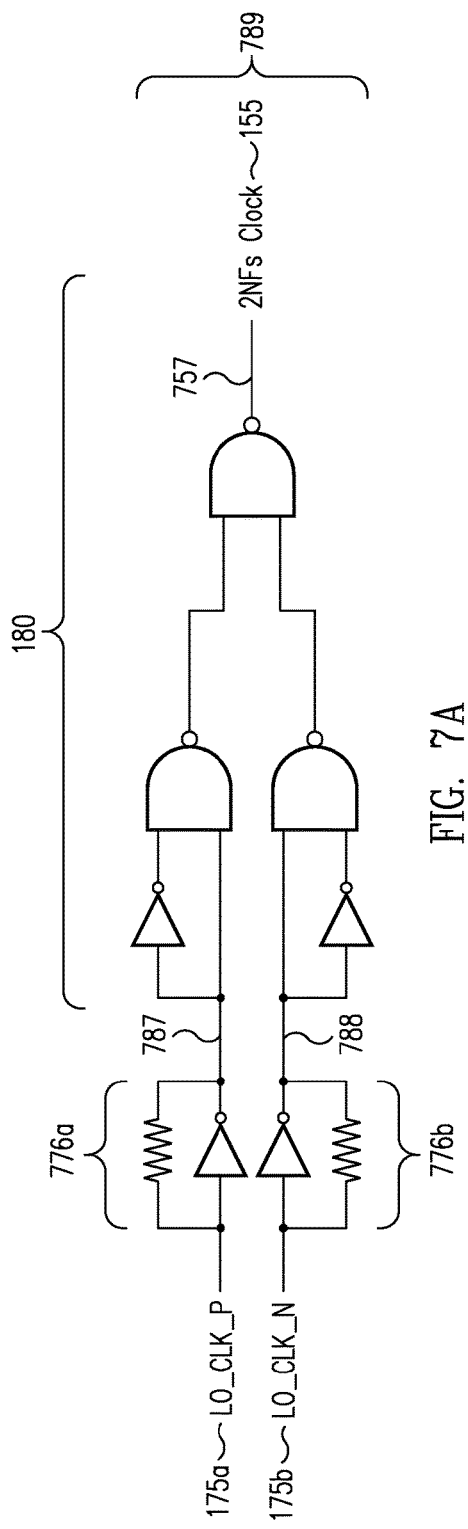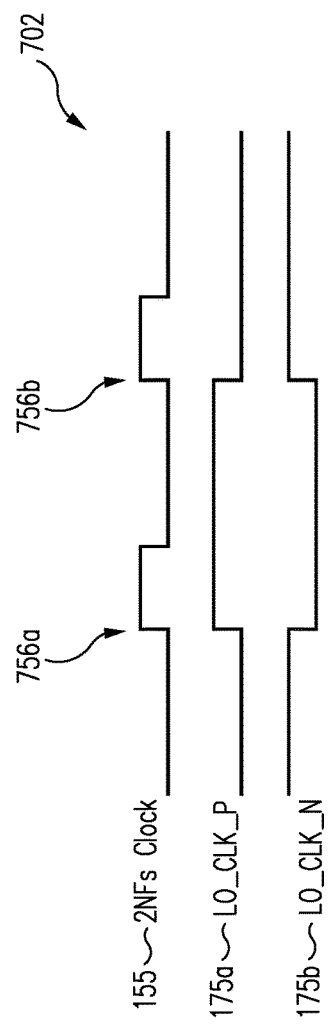

HIGH SPEED LOW POWER DIGITAL TO ANALOG UPCONVERTER

TECHNICAL FIELD

The present invention relates generally to digital to analog conversion and, more particularly, to high speed and low power digital to analog upconverter implementations.

BACKGROUND

In the field of high speed digital to analog conversion systems, particularly in satellite applications, there is an ongoing effort to include frequency upconversion in the digital domain by implementing higher speed digital to analog up converter circuits with integrated digital mixer circuits. However, time misalignment of digital data signals after the mixer circuit is a concern to achieving high speed upconversion system performance. The time misalignments are due in part to differences between data signal logic transitions and conversion clock transitions at the inputs of the digital mixer circuit.

Various conventional techniques attempt to reduce the time misalignments. For example, current mode logic circuit topologies may be used to reduce a portion of the time misalignments, but have the disadvantage of increasing power dissipation without significant improvement to system performance. Another conventional technique to address time misalignments may be to manually adjust physical signal paths in the digital to analog upconverter, but this step may be time consuming and may not be feasible if the digital to analog upconverter is used for different applications (e.g., frequency upconversion at different data rates).

SUMMARY

Systems and methods are disclosed herein in accordance with one or more embodiments that provide an improved approach to high speed digital to analog upconversion. A high speed digital to analog conversion system provides for converting a plurality of parallel digital data bits to an analog output voltage signal. In one example, a digital to analog upconverter includes various digital circuit components to perform logic operations and convert the frequency of incoming parallel digital data bits from a lower range to a higher range, where the parallel digital data bits become time misaligned with each other after the frequency conversion due to differences in logic states between a frequency conversion clock signal and each of the data bits. Parallel digital words corresponding to the time misaligned data bits are passed to a synchronizer circuit. The synchronizer circuit time aligns the parallel digital data bits and provides the time aligned parallel digital data bits to a switching network where the data bits are converted to an analog voltage signal.

In one embodiment, a system includes a decoder circuit configured to receive a plurality of decoder input data bits and provide a plurality of decoded parallel digital data bits, wherein the decoder circuit operates at a predefined sample rate; a mixer circuit coupled to the decoder circuit and configured to combine each of the decoded parallel digital data bits with a conversion clock signal to provide frequency shifted digital data bits, wherein the frequency shifted digital data bits are time misaligned with each other; a synchronizer circuit coupled to the mixer circuit comprising a synchronizer clock signal and configured to time align the frequency shifted digital data bits in response to the synchronizer clock signal; and a switching network coupled to the synchronizer circuit and configured to generate an analog output signal in response to the time aligned frequency shifted digital data bits.

In another embodiment, a method includes receiving, by a decoder circuit, a plurality of decoder input data bits; providing, by the decoder circuit, a plurality of decoded parallel digital data bits, wherein the decoder circuit operates at a predefined sample rate; combining, by a mixer circuit coupled to the decoder circuit, each of the decoded parallel digital data bits with a conversion clock signal to provide frequency shifted digital data bits, wherein the frequency shifted digital data bits are time misaligned with each other; aligning, by a synchronizer circuit coupled to the mixer circuit, the frequency shifted digital data bits in response to a synchronizer clock signal; and generating, by a switching network coupled to the synchronizer circuit, an analog output signal in response to the time aligned frequency shifted digital data bits.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 7A illustrates a block diagram of a dual-edge detector circuit in accordance with an embodiment of the disclosure.

FIG. 7B illustrates a timing diagram of a dual-edge detector circuit in accordance with an embodiment of the disclosure.

DETAILED DESCRIPTION

Figure 1:
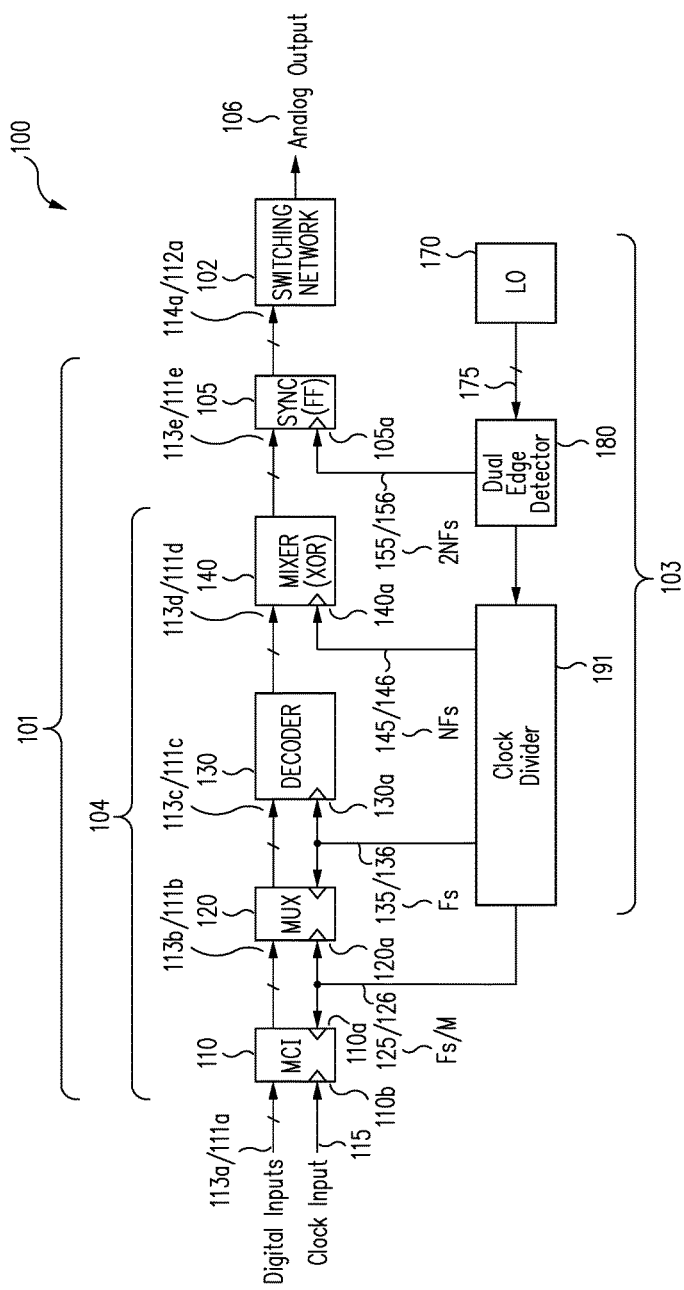
FIG. 1 illustrates a block diagram of a digital to analog conversion system in accordance with an embodiment of the disclosure.

Various implementations of a digital to analog frequency upconversion system are provided to reduce time misalignment of parallel digital data bits with each other before conversion to an analog signal. The digital to analog frequency upconversion system includes a decoder, a mixer, a synchronizer, a switching network, and a clock network used to convert parallel digital data bits to an analog voltage. In various embodiments, the digital to analog upconverter receives the parallel digital data bits from an external source such as a digital signal processor (DSP). In some embodiments, the digital to analog upconverter includes data paths including various digital components to perform logic operations on the parallel digital data bits comprised of multiplexing, decoding, and multiplying, where the parallel digital data bits become time misaligned with each other after the multiplication step due to differences in logic state transitions in decoding outputs relative to logic state transitions in a multiplying clock (e.g., such as conversion clock signal 145 of FIG. 1).

In various embodiments, the digital to analog upconverter includes a synchronizer circuit to perform time alignment of the time misaligned parallel digital data bits. In this regard, the synchronizer circuit provides for time alignment of the digital data bits prior to the switching network. Time alignment of the digital data bits at the input to the switching network is important to provide for high performance digital to analog conversion. In particular, the synchronizer circuit facilitates consistent output power over data frequency and temperature variations at the switching network output to maximize an effective number of bits, a key performance metric for a digital to analog converter.

In various embodiments, the synchronizer circuit is implemented as parallel flip flops, where each flip flop receives one of the parallel time misaligned digital data bits. A synchronizer clock signal is provided to each flip flop to sample the time misaligned data bit. In some embodiments, each flip flop may be a data (D) flip flop implemented to sample the data bit in response to the synchronizer clock signal. In some embodiments, the time misaligned data bits are sampled at twice the rate of the frequency conversion rate to eliminate any glitches or misalignments in the digital data bits.

In various embodiments, the clock network is implemented as a differential local clock, a dual-edge detector circuit, and a clock divider circuit. The differential local clock serves as a master clock and a differential local clock signal is provided to the dual-edge detector. The dual-edge detector converts the differential signal to a single ended synchronizer clock signal. In some embodiments, the synchronizer clock signal is a single ended pulsed output clock signal, where each pulsed output is generated at a rising and a falling edge of the differential clock signal to provide a frequency twice the differential clock signal frequency. Significantly, the synchronizer circuit provides for adaptability to vary the master differential local clock signal and maintain high speed performance without the need to manually re-tune the digital data paths.

The clock divider circuit is implemented to divide the single ended synchronizer clock signal to provide for a conversion clock signal, a decoder clock signal, and a multiplexer clock signal. In this regard, the digital to analog upconversion system is implemented with single ended clock signals to provide for a reduction in power dissipation and power consumption. In particular, the digital to analog upconversion system uses standard digital CMOS process fabrication techniques and single-ended circuit topologies operating in voltage mode to reduce overall size and power. For example, each of the circuit blocks consume substantially no bias power and primarily dissipate power during logic state transitions only.

FIG. 1 illustrates a block diagram of a digital to analog conversion system 100 in accordance with an embodiment of the disclosure. System 100 may be used to convert digital data signals into analog voltage signals in accordance with various techniques described herein. System 100 may be used on a variety of platforms, such as a land based platform, an airplane based platform, or a space based platform. In one embodiment, system 100 may be provided in a satellite communications system. In another embodiment, system 100 may be provided in a land based or airplane based radar system.

In one embodiment, system 100 includes a digital upconverter 101, a switching network 102, and a clock network 103. System 100 may be implemented as a high speed digital to analog conversion system where parallel digital data signals are received, frequency shifted and converted to an analog signal.

Digital upconverter 101 may include, for example, a data path 104 and a synchronizer circuit 105. Data path 104 includes various digital components such as a mesochronous interface (MCI) circuit 110, a multiplexer circuit 120, a decoder circuit 130, and a mixer circuit 140. Components of data path 104 provide for clock domain transfer of mesochronous interface circuit input data bits 111a (e.g., MCI input data words) by MCI circuit 110, multiplexing of multiplexer input data bits 111b (e.g., plurality of parallel digital data words) by multiplexer circuit 120, decoding decoder input data bits 111c by decoder circuit 130, and frequency shifting mixer input data bits 111d (e.g., decoded parallel digital data bits) by mixer circuit 140.

In some embodiments, data path 104 includes parallel data buses 113a-d, where each parallel data bus 113a-d includes data bits 111a-d, respectively. Data bits 111a-d, traveling through data path 104 may become time misaligned with each other after mixer circuit 140 due to differences in timing between logic state transitions at outputs of decoder circuit 130 (e.g., such as parallel digital data bits 238/239 of FIG. 2) and logic state transitions of conversion clock 145 during multiplication operations performed by mixer circuit 140. In some embodiments, unintended glitches may occur at outputs of mixer circuit 140.

In one embodiment, synchronizer circuit 105 includes, for example, multiple data (D) flip flops where each D flip flop receives a corresponding one of a time misaligned data bits 111e on parallel data bus 113e to synchronize time misaligned data bits 111e and provide time aligned frequency shifted data bits 112a to switching network 102 on corresponding parallel data bus 114a.

In some embodiments, switching network 102 receives time aligned data bits 112a and converts time aligned data bits 112a to a single ended analog output signal 106. Switching network 102 may be implemented as multiple CMOS inverter circuits driving a resistor network, where each CMOS inverter circuit receives a corresponding time aligned frequency shifted data bit 112a. Each CMOS inverter circuit and resistor network configuration is determined based on a weighting of the associated time aligned data bit 112a. Weighting of each of the time aligned frequency shifted data bits 112a is assigned by decoder circuit 130. In some embodiments, time aligned frequency shifted digital data bits 112a may be a combination of binary coded weighting and/or thermometer coded weighting, as discussed herein.

In some embodiments, clock network 103 includes a differential local clock 170, a dual-edge detector circuit 180, and a clock divider circuit 191. A differential local clock signal 175 is provided to dual-edge detector circuit 180 by differential local clock 170. Differential local clock signal 175 is converted to a single ended synchronizer clock signal 155 by dual-edge detector 180 having an integer multiple 156 of differential local clock signal 175 and provided to synchronizer circuit 105 at a synchronizer clock input 105a. In some embodiments, integer multiple 156 of differential local clock signal 175 is a two times multiplier to provide a synchronizer clock signal frequency (2NFs) two times the differential local clock signal 175 to synchronize time misaligned data bits 111e at synchronizer circuit 105.

In some embodiments, clock divider circuit 191 receives single ended synchronizer clock signal 155 and divides synchronizer clock signal 155 by an integer value 146 to provide a conversion clock signal 145 at a mixer circuit clock input 140a. In some embodiments, clock divider circuit 191 is implemented to divide conversion clock signal 145 by an integer value 136 to provide a decoder clock signal 135 at a decoder clock input 130a. In various embodiments, clock divider circuit 191 is implemented to divide decoder clock signal 135 by an integer value 126 (e.g., integer value M) to provide a multiplexer clock signal 125 at a multiplexer clock input 120a.

Multiplexer clock signal 125 may be provided to MCI circuit 110 at a MCI clock output 110a. MCI circuit 110 may receive an MCI clock signal 115 at a MCI clock input 110b. In some embodiments, MCI clock signal 115 is mesochronous with multiplexer clock signal 125 operating at a frequency equivalent to the frequency of multiplexer clock signal 125. Other embodiments are also contemplated for a digital to analog conversion system 100 that provides for time alignment of time misaligned parallel data bits 111e and converting the time aligned frequency shifted digital data bits 112a to an analog output voltage signal 106.

Figure 4:
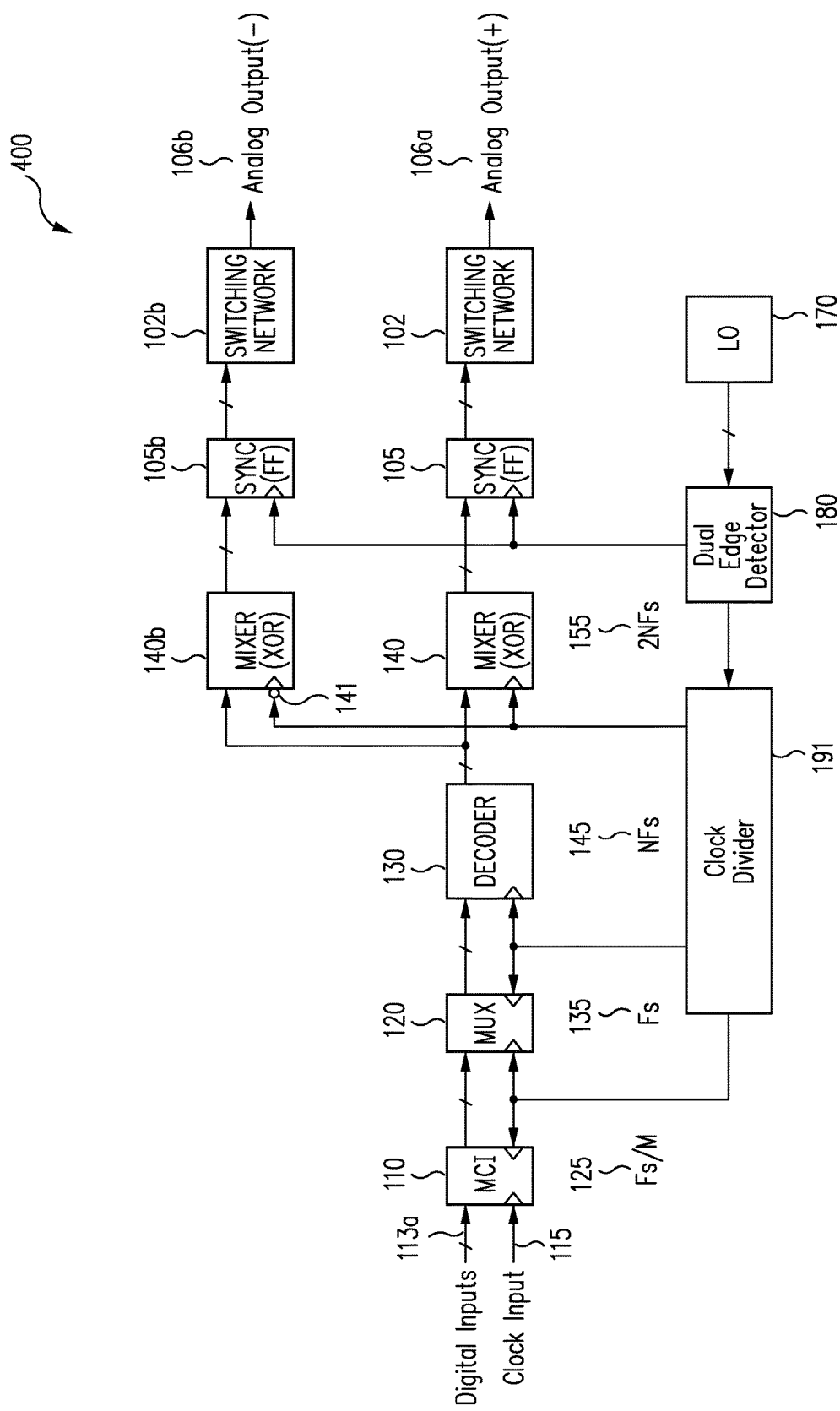
FIG. 4 illustrates a block diagram of a digital to analog conversion system providing a differential output in accordance with an embodiment of the disclosure.

For example, FIG. 4 illustrates a block diagram of a system 400 providing a differential output in accordance with an embodiment of the disclosure. As shown in FIG. 4, system 400 may be implemented with a differential analog output signal 106a and 106b. In this regard, system 400 provides for similar components used in system 100 to provide an analog output signal 106a, but in addition, includes components to provide a complementary analog output signal 106b. As shown in FIG. 4, an additional mixer circuit 140b, synchronizer circuit 105b, and switching network 102b provide for complementary analog output signal 106b, where additional components operate in a manner substantially similar. Additionally, conversion clock signal 145 is inverted at mixer circuit 140b clock input 141 to provide complementary analog output signal 106b. In particular, mixer circuits 140 and 140b are digital multipliers. In one embodiment, mixer circuits 140 and 140b alternately multiply outputs of decoder circuit 130 (e.g., parallel digital data bits 111d) by +/−1 (e.g., logic high/logic low). Additional mixer circuit 140b operates in opposite phase with respect to mixer circuit 140 to generate complementary analog output signal 106b. Although system 100 will be discussed, various embodiments provided by the present disclosure apply to system 400 where applicable.

Figure 2:
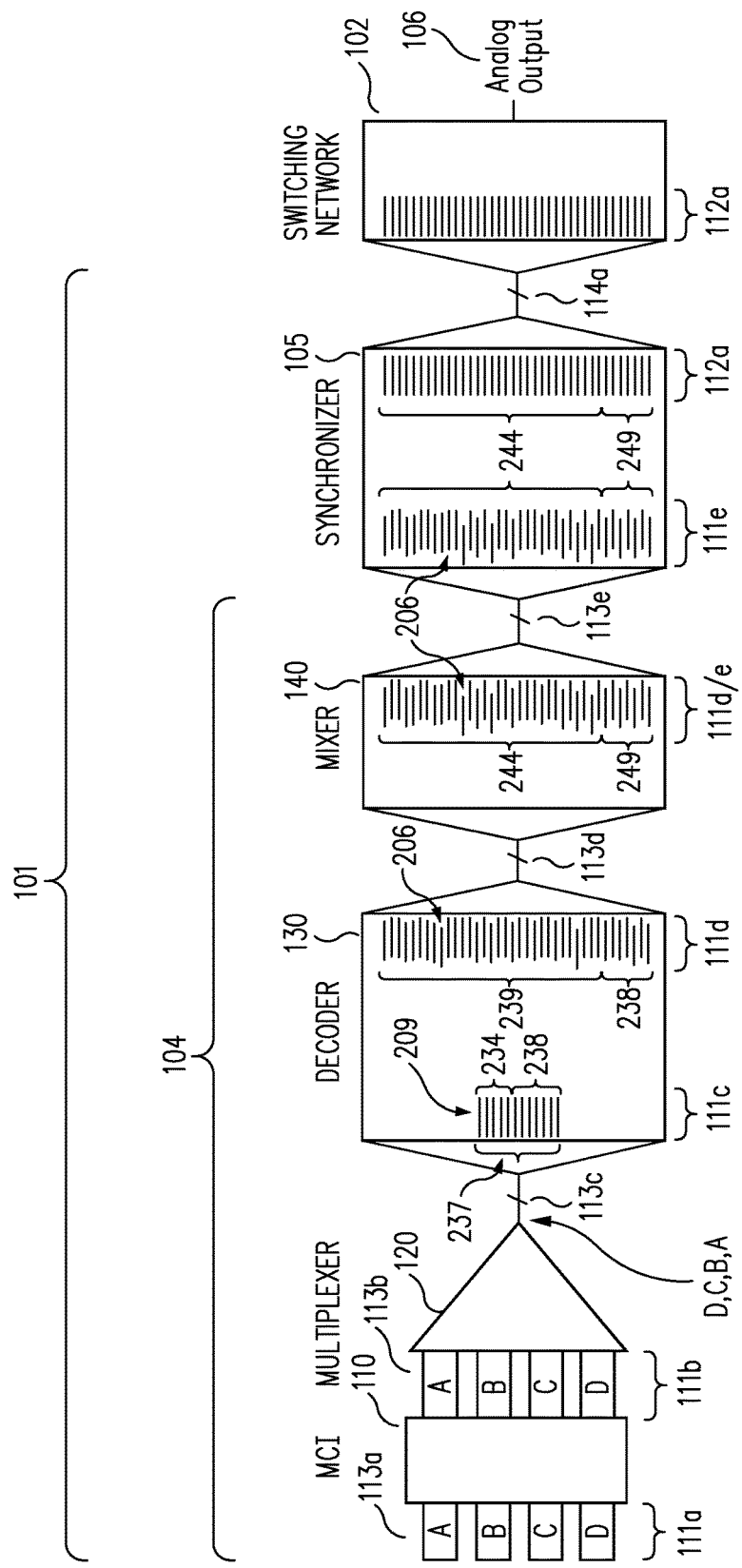
FIG. 2 illustrates various data bits passing through parallel data paths of a digital to analog conversion system in accordance with an embodiment of the disclosure.

FIG. 2 illustrates various data bits 111a-e passing through parallel data paths 104 of system 100 in accordance with an embodiment of the disclosure. FIG. 2 illustrates processing of data bits 111a-e, as data bits 111a-e pass through digital components MCI 110, multiplexer circuit 120, decoder circuit 130, and mixer circuit 140. Parallel data bus 113a may include data bits 111a provided in parallel digital words A-D. In some embodiments, digital words A-D (e.g., MCI input data words) each contain twelve parallel data bits 111a. MCI circuit 110 passes MCI input data bits 111a corresponding to parallel digital words A-D to multiplexer circuit 120 at the multiplexer clock rate (Fs/M) and multiplexer clock domain, as discussed herein.

Multiplexer circuit 120 receives multiplexer input data bits 111b corresponding to parallel digital data words A-D (e.g., parallel digital data words 111b) on parallel data bus 113b and provides a serial data stream 208 corresponding to one bit 209 of each of the parallel digital words A-D (e.g., twelve data bits 111c of each of parallel digital words A-D) to decoder circuit 130 on parallel data bus 113c. In this regard, multiplexer circuit 120 provides parallel digital data words A, B, C, D in serial order on parallel data bus 113c, where multiplexer circuit 120 selects serial digital data word order A, B, C, D, where digital data word A is clocked first followed by B, C, and D as shown in FIG. 2. By way of example, a 4:1 multiplexer is shown in FIG. 2. However, other multiplexer configurations are possible in other embodiments.

Decoder circuit 130 receives a parallel digital word 237 (e.g., one of parallel digital words A, B, C, or D) including decoder input data bits 111c on parallel data bus 113c. Data bits 111c include a first subset 234 (e.g., five data bits 111c) and a second subset 238 (e.g., seven data bits 111c). In some embodiments, decoder circuit 130 converts first subset 234 to a second format 239. In some embodiments, five binary coded data bits (e.g., first subset 234) are converted to thirty-one thermometer coded (e.g., second format 239) data bits 111d to provide thirty-eight decoded parallel digital data bits 111d consisting of thirty-one thermometer coded data bits 111d and seven binary coded data bits 111d on parallel data bus 113d. One or more data bits 111d may be time misaligned with each other due to latencies 206 associated with logic operations performed in decoder circuit 130. It will be understood that other embodiments may include other types of coded data bits and decoder circuit may decode more or fewer data bits to one or more types of decoding configurations.

Mixer circuit 140 receives decoded parallel digital data bits 111d (e.g., mixer input data bits) on parallel data bus 113d. In some embodiments, decoded parallel digital data bits 111d may include a first subset 244 of data bits 111d (e.g., a first subset of thermometer coded data bits) and a second subset 249 of data bits 111d (e.g., a second subset of binary coded data bits). In some embodiments, mixer input data bits 111d are frequency shifted using conversion clock signal 145. In some embodiments, conversion clock signal 145 is substantially the same frequency as differential clock signal 175 frequency. In other embodiments, conversion clock signal 145 is an integer multiple of differential clock signal 175 frequency. Frequency shifted digital data bits 111e including frequency shifted first subset 244 and second subset 249 time misaligned data bits 111e are provided to synchronizer circuit 105 on parallel data bus 113e. One or more frequency shifted digital data bits 111e may be time misaligned with each other after multiplication operations performed by mixer circuit 140, as discussed herein.

In one embodiment, synchronizer circuit 105 receives frequency shifted first subset 244 and second subset 249 time misaligned data bits 111e on parallel data bus 113e. Data bits 111e are received from mixer circuit 140 of data path 104. Synchronizer circuit 105 performs operations to time align data bits 111e to provide time aligned frequency shifted digital data bits 112a on parallel data bus 114a, as discussed herein. In various embodiments, synchronizer circuit 105 performs time alignment of time misaligned data bits 111e at a synchronizer clock signal 155 frequency twice the differential clock signal 175 frequency to reduce system 100 susceptibility to process, temperature, and power supply variations. However, other frequency multiples of differential clock signal 175 are possible for synchronizer clock signal 155. Outputs (e.g., data bits 112a) of synchronizer circuit 105 are provided to switching network 102. Switching network 102 converts data bits 112a to analog output signal 106. Analog output signal 106 dominant spectral energy is centered around the frequency of conversion clock signal 145.

Figure 3:
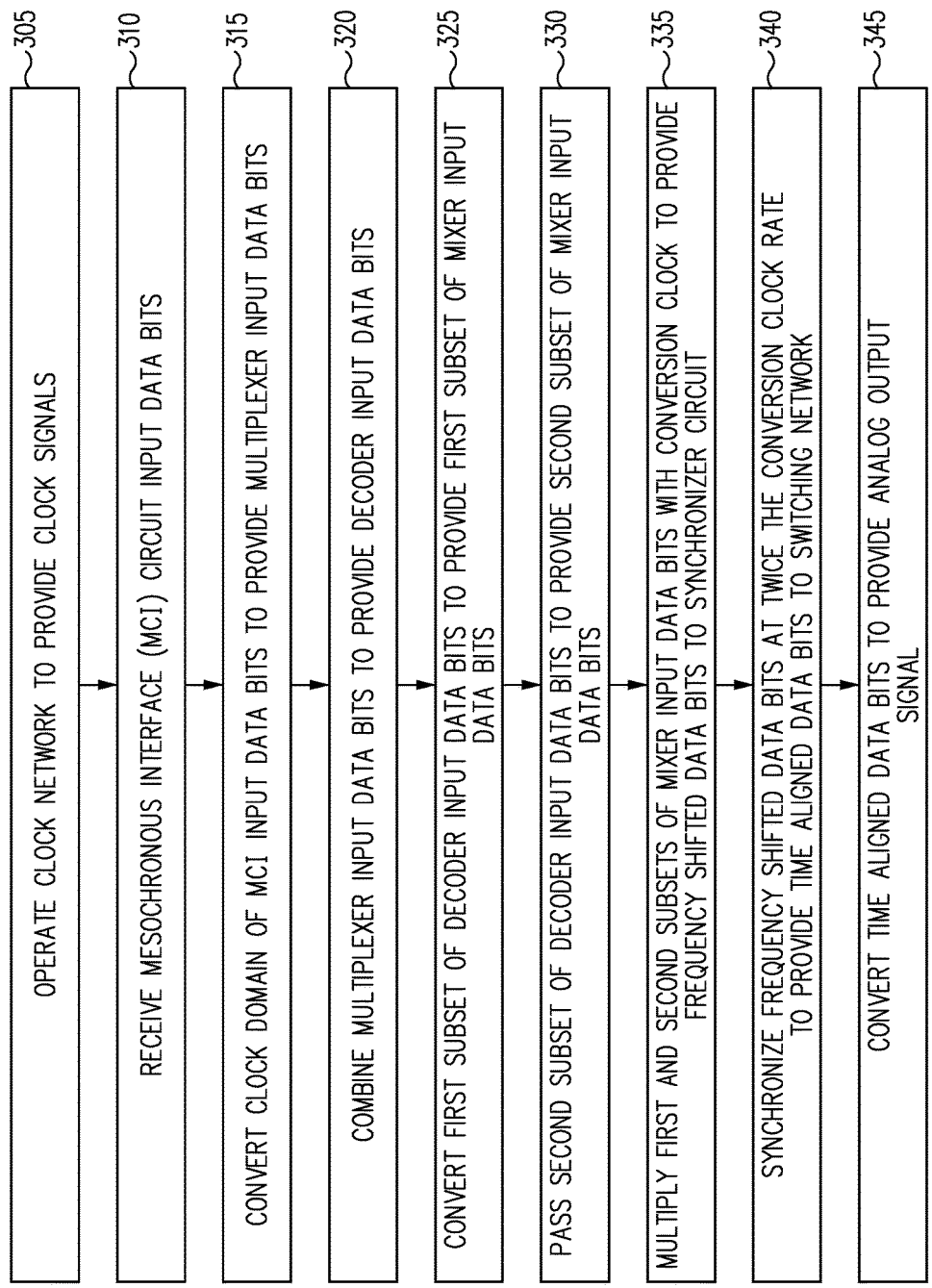
FIG. 3 illustrates a process of operating a digital to analog conversion system in accordance with an embodiment of the disclosure.

FIG. 3 illustrates a process of operating system 100 in accordance with an embodiment of the disclosure. In describing the process of operating system 100, reference may be made to one or more of FIGS. 4-11. Furthermore, steps of FIG. 3 may be performed in an order different than that discussed herein.

In block 305, the process begins with operating clock network 103 to provide clock signals to components of system 100. In this regard, clock network 103 includes a differential local clock 170, a dual-edge detector circuit 180, and a clock divider circuit 191, as discussed herein. Dual-edge detector circuit 180 receives differential local clock signal 175 from differential local clock 170 to provide single ended synchronizer clock signal 155, as discussed herein. FIG. 7A illustrates a block diagram of a dual-edge detector circuit 180 in accordance with an embodiment of the disclosure.

Referring now to FIG. 7A, a positive differential clock signal 175a (e.g., LO_CLK_P) is provided to a first input port 787 of dual-edge detector circuit 180. A negative differential clock signal 175b (e.g., LO_CLK_N) is provided to a second input port 788 of dual-edge detector circuit 180. Positive and negative differential clock signals 175a and 175b includes resistor feedback amplifiers 776a and 776b, respectively. Dual-edge detector circuit 180 includes multiple logic gates 789 to perform logic operations in response to positive differential clock signal 175a and negative differential clock signal 175b to form synchronizer clock signal 155 (e.g., 2NFs Clock), where synchronizer clock signal 155 is a single ended clock signal 757 having a frequency (2NFs) that is twice the frequency of differential clock signal 175 (NFs).

FIG. 7B illustrates a timing diagram 702 of a dual-edge detector circuit 180 in accordance with an embodiment of the disclosure. Referring now to FIG. 7B, timing diagram 702 illustrates a relation between synchronizer clock signal 155, and positive differential clock signal 175a, and negative differential clock signal 175b. FIG. 7B shows that a synchronizer clock first pulse 756a is formed in response to a rising edge of positive differential clock signal 175a, and/or a falling edge of negative differential clock signal 175b. Furthermore, a synchronizer clock second pulse 756b is formed in response to a falling edge of positive differential clock signal 175a, and/or a rising edge of negative differential clock signal 175b. In this regard, synchronizer clock signal 155 implements a frequency twice (e.g., an integer multiple of) the frequency of differential local clock signal 175.

Figure 5:
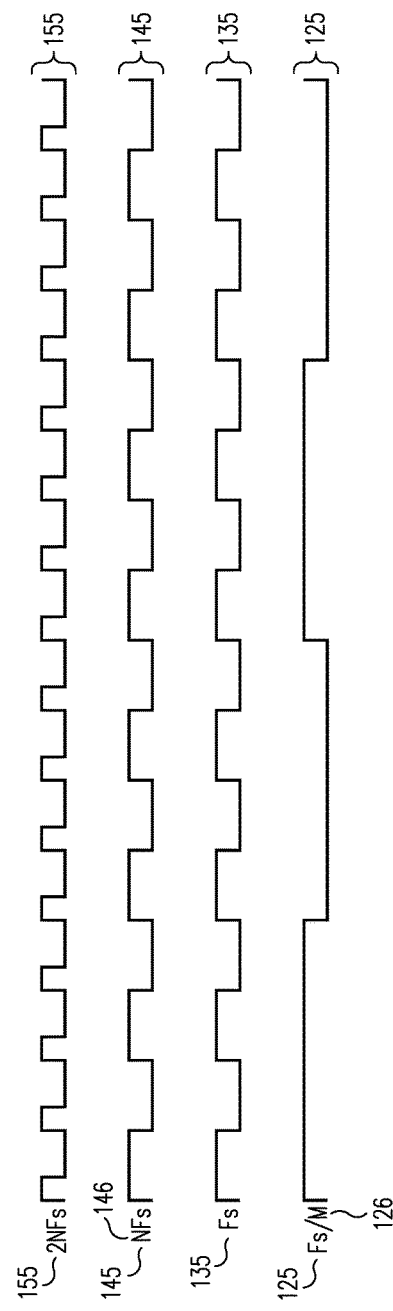
FIG. 5 illustrates a timing diagram of a clock network in accordance with an embodiment of the disclosure.

Referring now to FIG. 3, in block 305, clock divider circuit 191 receives single ended synchronizer clock signal 155 and divides synchronizer clock signal 155 by an integer value 146 to provide conversion clock signal 145, as discussed herein. Clock divider circuit 191 is implemented to divide conversion clock signal 145 by an integer value 136 to provide decoder clock signal 135, as discussed herein. Clock divider circuit 191 is implemented to divide decoder clock signal 135 by an integer value 126 (e.g., integer value M) to provide multiplexer clock signal 125, as discussed herein. FIG. 5 illustrates a timing diagram of clock network 103 in accordance with an embodiment of the disclosure.

Referring now to FIG. 5, a relation between synchronizer clock signal 155, conversion clock signal 145, decoder clock signal 135, and multiplexer clock signal 125 is shown. For example, in the embodiment illustrated, integer multiple 146 is equal to one, and integer multiple 126 is equal to four. Furthermore, differential local clock signal 175 (not shown) is 3.2 Gsps. In this regard, conversion clock signal 145, and decoder clock signal 135 are 3.2 Gsps, and multiplexer clock signal 125 is 0.8 Gsps. In some embodiments, decoder clock signal 135 is configured to operate at a predefined sample rate Fs. As shown in FIG. 5, synchronizer clock signal 155 is twice the differential local clock signal 175, or 6.4 Gsps. In addition, time misaligned data bits 111e are sampled at 6.4 Gsps by synchronizer circuit 105. Sampling by synchronizer circuit 105 at synchronizer clock signal 155 sample rate facilitates consistent output power over data frequency and temperature variations at the switching network output, as discussed herein. It is understood the timing diagram of FIG. 5 provides a non-limiting embodiment of the present disclosure. Other timing diagrams with other clock rates are possible in other embodiments.

Referring again to FIG. 3, in block 310 mesochronous interface (MCI) circuit 110 receives input data bits 111a corresponding to parallel digital data words A-D (e.g., MCI input data words) on parallel data bus 113a. MCI receives multiplexer clock signal 125 at MCI clock output 110b and MCI clock signal 115 at MCI clock input 110a where MCI clock signal 115 is mesochronous with multiplexer clock signal 125, as discussed herein. MCI input data bits 111a are clocked by MCI clock signal 115 to receive MCI input data bits 111a at MCI 110.

In block 315, MCI 110 converts clock domain of MCI input data bits 111a using multiplexer clock signal 125 to clock multiplexer input data bits 111b to multiplexer circuit 120. Multiplexer input data bits 111b correspond to parallel digital data words A-D.

In block 320, multiplexer circuit 120 receives multiplexer input data bits 111b corresponding to parallel digital data words A-D on parallel data bus 113b. Multiplexer circuit 120 combines multiplexer input data bits 111b to provide decoder input data bits 111c clocked by decoder clock signal 135 to decoder circuit 130. In this regard, multiplexer circuit 120 selects a corresponding one of parallel digital data words A-D, where one of parallel digital data words A-D are selected to be provided to decoder circuit 130. Subsequent clock cycles provide the remainder of parallel digital data words A-D. The order of clocking parallel digital data words is A, B, C, D, where digital data word A is clocked first followed by B, C, and D. Clocking digital data word A-D using decoder clock signal 135 provides for an equivalent throughput of clocking parallel digital data words A-D using multiplexer clock signal 125.

In block 325, decoder circuit 130 receives decoder input data bits 111c including a first subset 234 and a second subset 238, where each subset 234 and 238 are a first format (e.g, such as binary coded data bits). In some embodiments, at least the first subset 234 of decoder input data bits 111c are converted to second format 239 (e.g., such as thermometer coded data bits). In this regard, a first subset 244 of decoded data bits 111d are provided to mixer circuit 140.

In block 330, in some embodiments, second subset 249 of data bits 111d are passed to mixer circuit 140 without decoding (e.g., remaining binary coded data bits), as discussed herein.

Figure 6A:
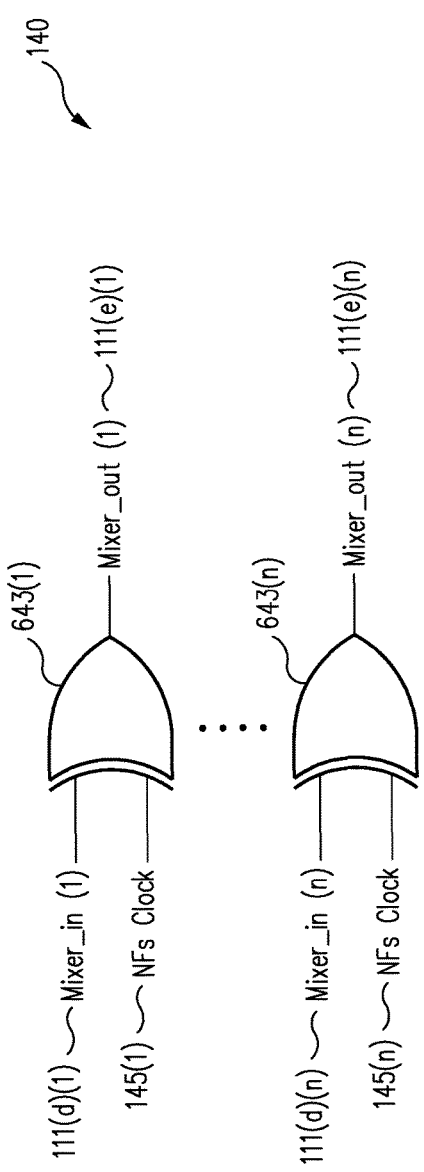
FIG. 6A illustrates a block diagram of a mixer circuit in accordance with an embodiment of the disclosure.

In block 335, mixer circuit 140 receives mixer input data bits 111d including first subset data bits 244 and second subset data bits 249. FIG. 6A illustrates a block diagram of a mixer circuit 140 in accordance with an embodiment of the disclosure. Referring to FIG. 6A, in some embodiments, mixer circuit 140 includes multiple exclusive OR logic components 643(1) through 643(n) receiving conversion clock signals 145(1) through 145(n) (e.g., NFs Clock) and decoded parallel digital data bits 111(d)(1) (e.g., Mixer_in (1)) through 111(d)(n) (e.g., Mixer_in (n)), and providing frequency shifted digital data bits 111(e(1) (e.g., Mixer_out (1)) through 111(e)(n) (e.g., Mixer_out(n). In this regard, each mixer exclusive OR circuit 643 combines one data bit 111d and one conversion clock signal 145 to provide a corresponding frequency shifted digital data bit 111e. Other embodiments of mixer circuit 140 are possible. For example, mixer circuit 140 may include multiplexers or other complex logic gates to implement operational functionality of mixer circuit 140.

Figure 6B:
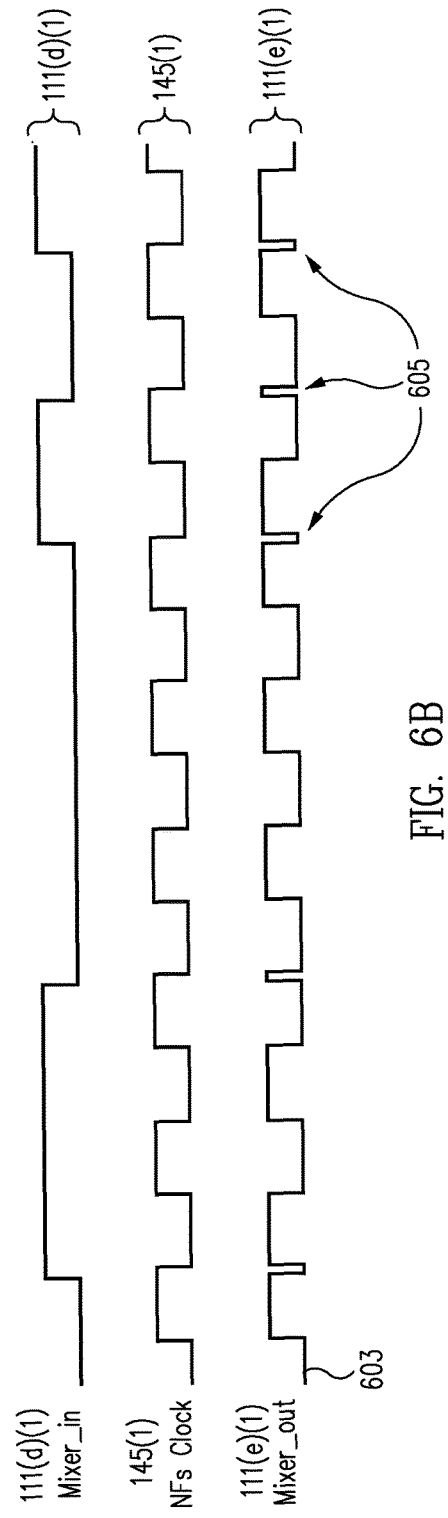
FIG. 6B illustrates a timing diagram of a mixer circuit in accordance with an embodiment of the disclosure.

FIG. 6B illustrates a timing diagram of a mixer circuit 140 in accordance with an embodiment of the disclosure. Referring now to FIG. 6B, timing diagram provides mixer input data bits 111(d)(1) (e.g., Mixer_in), conversion clock signal 145(1) (e.g., NFs Clock), and data signal 603 of mixer output data bits 111(e)(1) (e.g., Mixer_out). As illustrated, logic operations are performed on data bits 111(d)(1) and clock signal 145(1) to provide data bits 111(e)(1). In this regard, data signal 603 of data bits 111(e) (1) transitions high when data bits 111(d)(1) and clock signal 145(1) are at different logic states, effectively multiplying data bits 111 (d)(1) with conversion clock signal 145 to shift the energy of data bits 111(d)(1) to center around conversion clock signal frequency NFs.

As FIG. 6B illustrates, frequency shifted digital data bits 111e may become time misaligned with each other due to time misalignment associated with logic state transitions of each of the decoded parallel digital data bits 111(d) and logic state transitions of the conversion clock signal 145. Additionally, data bits 111e may have undesirable glitches 605 due to time misalignment of edges between mixer input data bits 111(d)(1) and conversion clock signal 145(1).

Figure 6C:
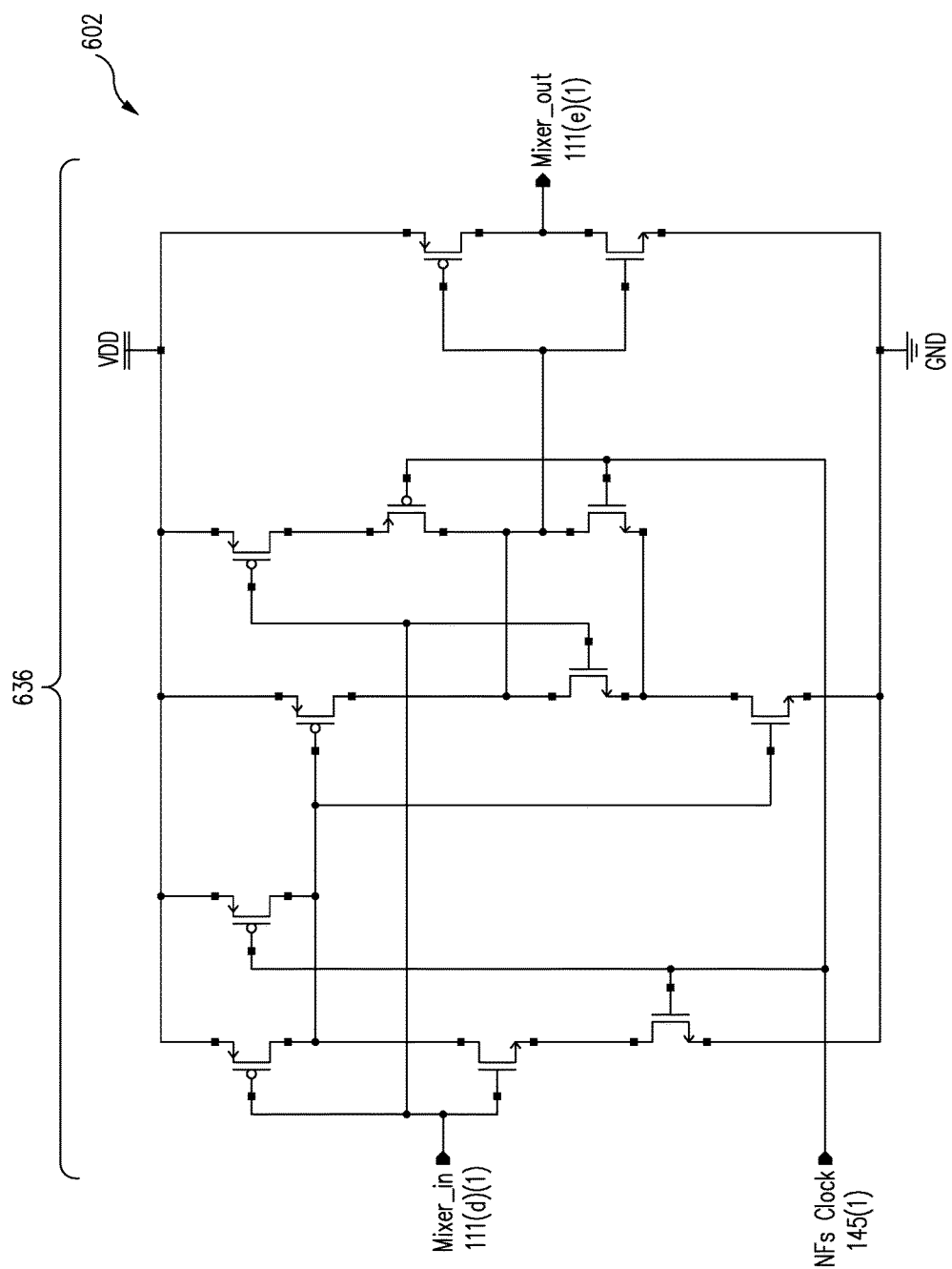
FIG. 6C illustrates a schematic diagram of a mixer circuit in accordance with an embodiment of the disclosure.

FIG. 6C illustrates a schematic diagram of a mixer circuit 602 (e.g., a digital mixer cell) in accordance with an embodiment of the disclosure. Referring now to FIG. 6C, schematic diagram of mixer circuit 602 provides for a single mixer input data bit 111(d)(1) (e.g., Mixer_in), conversion clock signal 145(1) (e.g., NFs Clock), and mixer output data bit 111(e)(1) (e.g., Mixer_out). In some embodiments, mixer circuit 140 includes mixer circuit 602 for each data bit 111d. In this regard, the number of mixer circuits 602 required may vary based on the number of decoded data bits 244 and undecoded data bits 249 of data bits 111d provided by decoder circuit 130. In various embodiments, logic operations are performed on each of mixer inputs data bits 111d with conversion clock signal 145 to provide possible time misaligned data bits 111e to synchronizer circuit 105.

As shown in FIG. 6C, mixer circuit 602 is implemented as a CMOS voltage mode circuit 636. Static power is reduced as there are no constant current sources included within CMOS voltage mode circuit 636. Furthermore, power is dissipated primarily during data and clock logic state transitions, resulting in a reduction in power dissipation. In this regard, voltage mode topology provides for reduced power dissipation and power consumption important in space based applications.

Figure 8A:
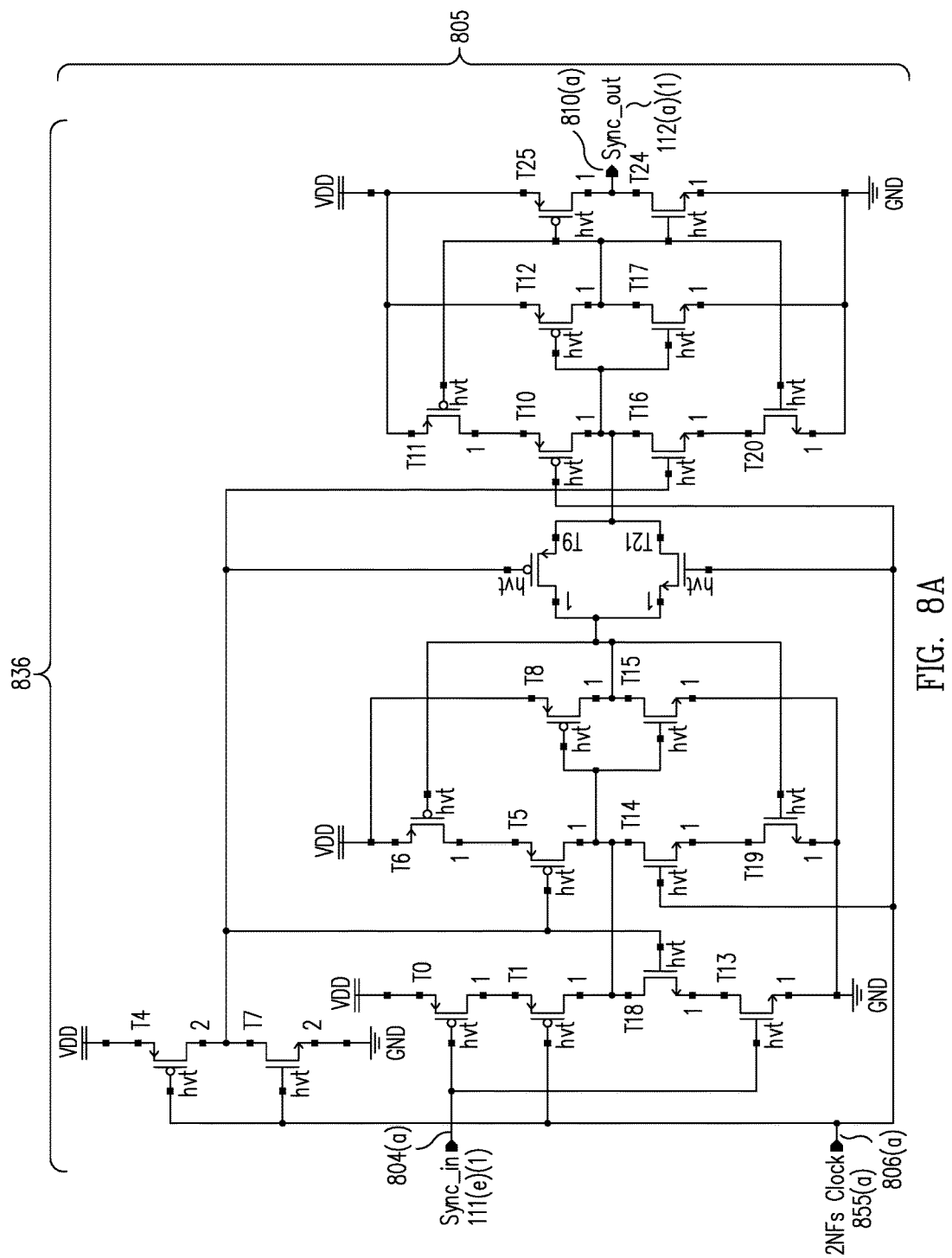
FIG. 8A illustrates a schematic diagram of a synchronizer circuit in accordance with an embodiment of the disclosure.

In block 340, time misaligned data bits 111e are synchronized to provide time aligned frequency shifted digital data bits 112a to switching network 102. FIG. 8A illustrates a schematic diagram of a synchronizer circuit 105 in accordance with an embodiment of the disclosure. Referring now to FIG. 8A, schematic diagram of synchronizer circuit 105 provides for single synchronizer input data bit 111(e)(1) (e.g., Sync_in) at a synchronizer circuit data input 804(a), a synchronizer clock signal 855(a) (e.g., 2NFs Clock) at a synchronizer circuit clock input 806(a), and synchronizer output data bit 112(a)(1) (e.g., Sync_out) at a synchronizer circuit data output 810(a).

In some embodiments, synchronizer circuit 105 is implemented as a data (D) flip flop circuit 805, where D flip flop circuit 805 latches time misaligned data bit 111(e)(1) in response to synchronizer clock signal 855a to provide time aligned frequency shifted digital data bit 112(a)(1) at synchronizer circuit data output 810(a). In this regard, time misaligned data bit 111(e)(1) is held at synchronizer circuit data input 804(a) until a rising edge of single ended synchronizer clock signal 855a is provided at synchronizer circuit clock input 806(a) to provide time aligned data bit 112(a)(1) to switching network 102.

In some embodiments, synchronizer circuit 105 includes multiple (D) flip flop circuits 805, where each (D) flip flop circuit 805 is provided for each data bit 111(e)(1) through 111(e)(n). In this regard, the number of (D) flip flop circuits 805 required may vary based on the number of decoded 244 and undecoded 249 time misaligned data bits 111e provided by mixer circuit 140. In some embodiments, (D) flip flop circuit 805 and synchronizer circuit 105 is implemented as a CMOS voltage mode circuit 836.

Figure 8B:
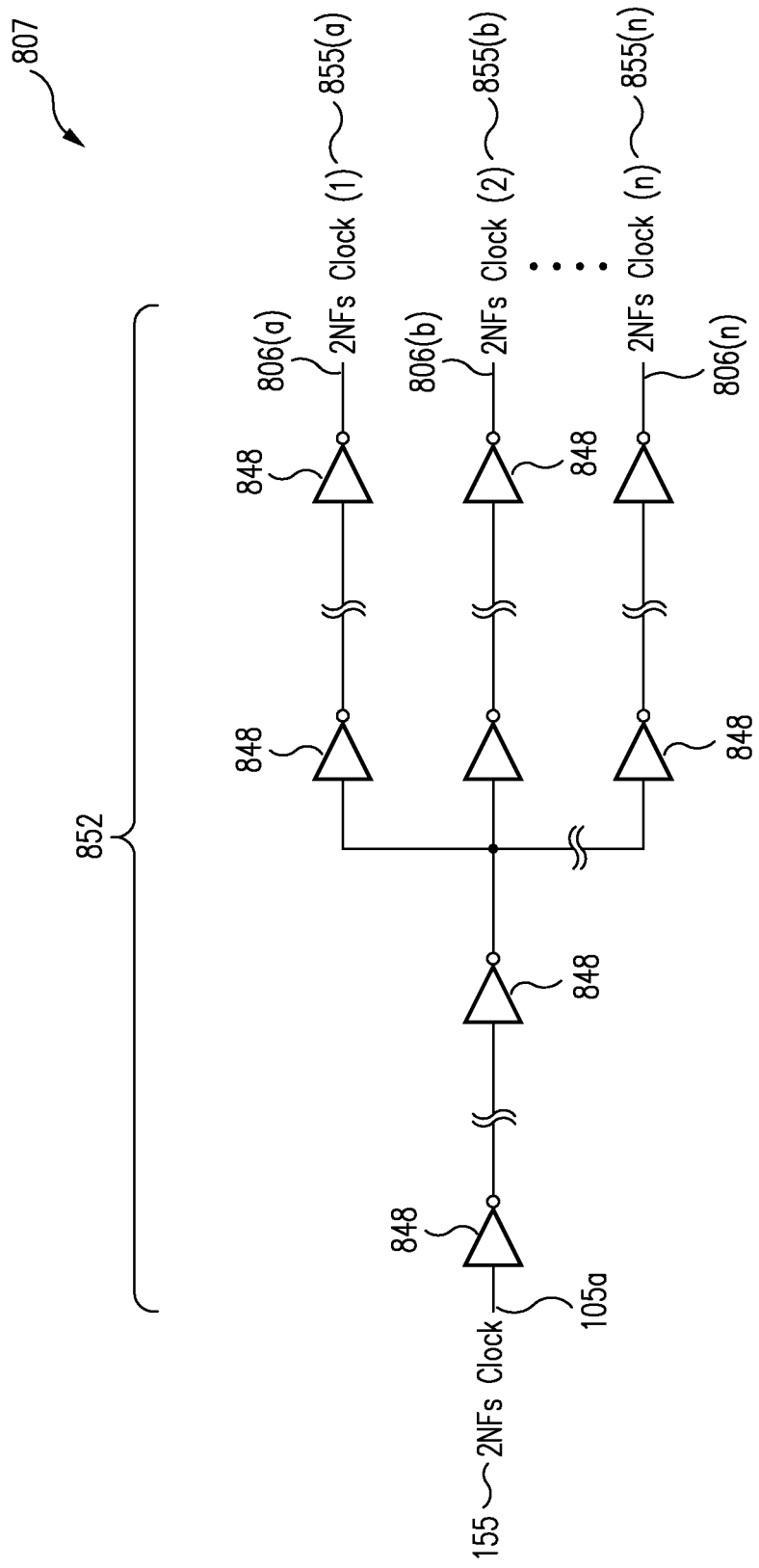
FIG. 8B illustrates a schematic diagram of a synchronizer clock distribution circuit in accordance with an embodiment of the disclosure.

In some embodiments, synchronizer clock signal 155 is fanned out to each D flip flop circuit 805. FIG. 8B illustrates a schematic diagram of a synchronizer clock distribution circuit 807 in accordance with an embodiment of the disclosure. Referring now to FIG. 8B, synchronizer clock distribution circuit 807 provides for a clock distribution of synchronizer clock signal 155 to each of D flip flop circuits 805 of synchronizer circuit 105.

As shown in FIG. 8B, clock distribution path 852 provides for an identical number of inverter stages 848 for each synchronizer clock signal 855a-n along the signal path from synchronizer clock input 105a to each corresponding synchronizer circuit clock input 806a-n. By providing an equivalent number of inverter stages 848 along each signal path of synchronizer clock signals 855a-n, propagation delay between clock signals 855a-n at clock inputs 806a-n is minimized. Significantly, simultaneous rising edges of synchronizer clock signals 855a-n is provided at corresponding clock inputs 806a-n of corresponding D flip flop circuit 805a-n to simultaneously clock time misaligned data bits 111(e)(1) through 111(e)(n) to provide time aligned data bits 112(a)(1) through 112(a)(n) at corresponding D flip flop circuit data outputs 810a-n. In this regard, synchronizer circuit 105 provides time aligned data bits 112a to switching network 102.

Figure 9:
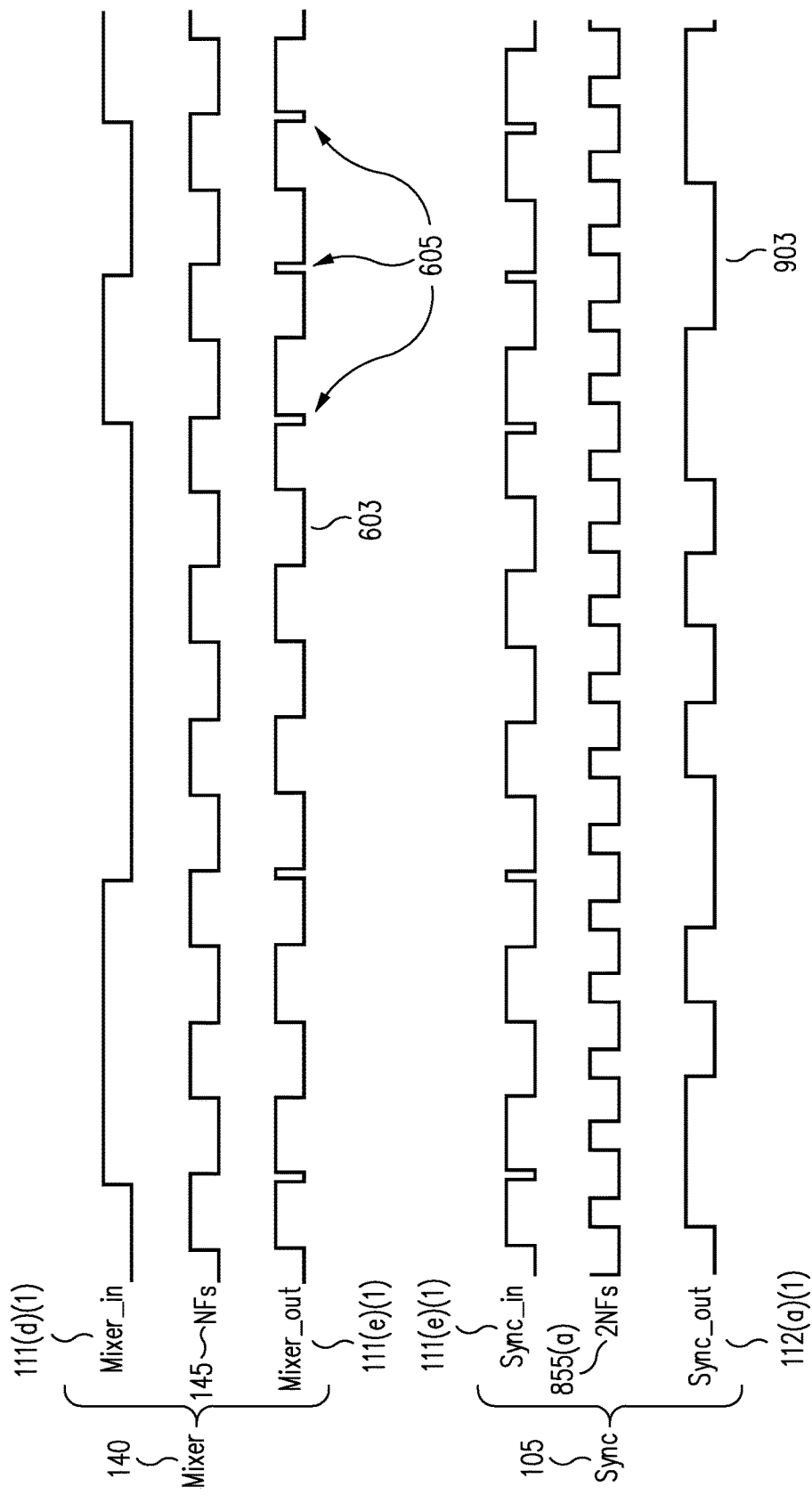
FIG. 9 illustrates timing diagrams of a mixer circuit and a synchronizer circuit in accordance with an embodiment of the disclosure.

FIG. 9 illustrates timing diagrams of a mixer circuit 140 and a synchronizer circuit 105 in accordance with embodiments of the disclosure. FIG. 9 shows the timing functions for one data bit 111e in the mixer circuit 140 and one data bit 112a in the synchronizer circuit 105 to illustrate how glitches 605 may occur at the mixer output and how the synchronizer circuit 105 removes glitches 605 in addition to alignment of the multiple data bits 111e using the synchronizer clock signal 155. Referring now to FIG. 9, timing diagrams provide mixer circuit 140, mixer input data bits 111(d)(1) (e.g., Mixer_in), conversion clock signal 145(1) (e.g., NFs Clock), and data signal 603 of mixer output data bits 111(e)(1) (e.g., Mixer_out). Additionally timing diagrams provide synchronizer circuit 105, synchronizer input data bits 111(e)(1) (e.g., Sync_in), synchronizer clock signal 855(a) (e.g., 2NFs Clock), and data signal 903 of synchronizer output data bits 112(a)(1) (e.g., Sync_out). As shown, FIG. 9 illustrates frequency shifting of data bits 111(d)(1) to provide time misaligned data bits 111(e)(1) that may also have undesirable glitches 605 due to time misalignment of edges between mixer input data bits 111(d)(1) and conversion clock signal 145, as discussed herein. Frequency shifted digital data bits 111(e)(1) are provided to synchronizer circuit 105, where data bits 111(e)(1) are sampled to provide time aligned frequency shifted digital data bits 112(a)(1) and to remove glitches 605.

FIG. 9 shows synchronizer clock signal 855(a) samples synchronizer input data bits 111(e)(1) to provide for accurate, high speed time alignment of data bits 111(e)(1), as discussed herein. In some embodiments, conversion clock signal 145(1) frequency shifts data bits 111(e)(1) at a conversion rate of 3.2 Gsps. Synchronizer clock signal 855(a) samples data bits 111(e)(1) at a synchronizer clock rate of 6.4 Gsps, twice the mixer circuit sampling rate. However, higher or lower sampling rates are possible with other embodiments. Synchronizer circuit 105 provides for adaptability to modify sampling rates without the need to re-tune or re-design system 100.

Figure 10:
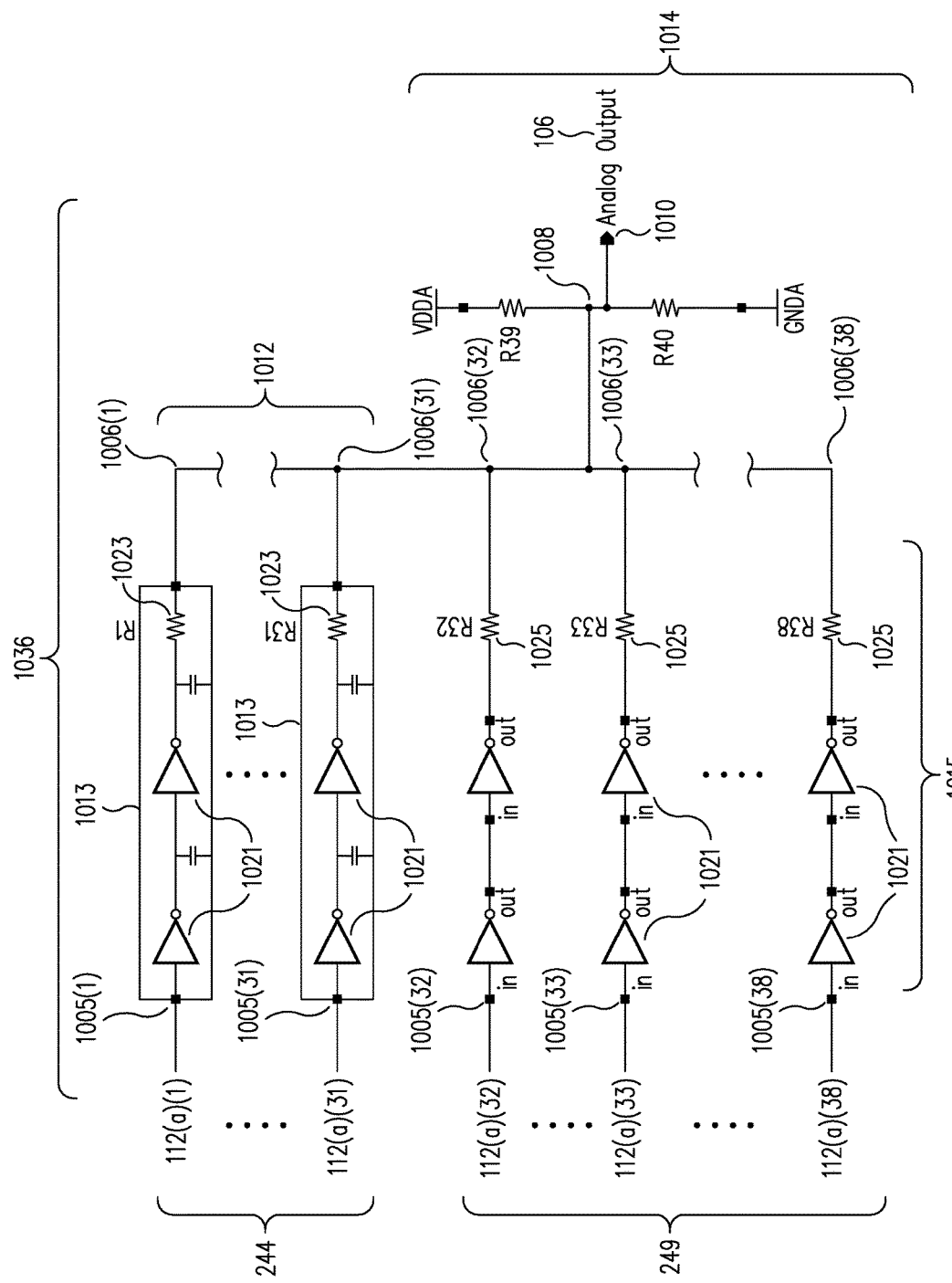
FIG. 10 illustrates a schematic diagram of a switching network circuit in accordance with an embodiment of the disclosure.

In block 345, time aligned frequency shifted digital data bits 112a are converted to analog voltage signals and summed to provide analog output signal 106. In this regard, switching network 102 receives time aligned data bits 112a and converts time aligned data bits 112a to corresponding analog voltage signals, as discussed herein. FIG. 10 illustrates a schematic diagram of a switching network circuit 102 in accordance with an embodiment of the disclosure.

Referring to FIG. 10, in some embodiments, switching network 102 may be implemented as multiple CMOS inverter circuits driving a resistor network (e.g., such as thermometer weighted circuits 1013 and binary weighted circuits 1015), where each CMOS inverter circuit resistor network receives a corresponding time aligned data bit 112a based on an assigned weighting of data bit 112a and converts the corresponding digital data bit 112a to a corresponding voltage signal 1006. Voltage signals 1006 are summed at a summing node 1008 and provided as analog output signal 106. It will be appreciated that the number of voltage signals 1006 and/or resistors 1023/1025 may vary based on the number of time aligned frequency shifted digital data bits 112a.

In some embodiments, as shown in FIG. 10, first subset 244 of thermometer decoded data bits 112(a)(1) through 112(a)(31) are provided to thermometer weighted circuits array 1012 and second subset 249 of binary undecoded data bits 112(a)(32) through 112(a)(38) are provided to binary weighted circuits array 1014. In this regard, switching network 102 receives thermometer decoded data bits 112(a)(1) through 112(a)(31) at switching network inputs 1005(1) through 1005(31), respectively. Switching network 102 receives binary undecoded data bits 112(a)(32) through 112(a)(38) at switching network inputs 1005(32) through 1005(38), respectively.

In some embodiments, each of a multiple of thermometer weighted circuits 1013 of switching network 102 includes a series pair of inverter circuits 1021 and a fixed value resistor 1023. In this regard, each of thermometer decoded data bits 112(a)(1) through 112(a)(31) are weighted equally and a substantially equivalent voltage at output 1006(1) through 1006(31) are provided to summing node 1008 by each of thermometer weighted circuits 1013.

In some embodiments, each of a multiple of binary weighted circuits 1015 of switching network 102 includes series pair of inverter circuits 1021 and a variable value resistor 1025. A value of variable resistor 1025 for each data bit 112(a)(32) through 112(a)(38) is identified based on a weight of binary data bits 112(a)(32) through 112(a)(38). For example, data bit 112(a)(38) may be a less significant bit than data bit 112(a)(31). In this regard, voltage signal at output 1006(38) corresponding to data bit 112(a)(38) would be less than voltage signal at output 1006(31) corresponding to data bit 112(a)(31). Accordingly, variable resistor 1025 coupled to output 1006(38) would be a larger value than variable resistor 1025 coupled to output 1006(31). In this regard, each of binary undecoded data bits 112(32) through 112(a)(38) are weighted proportional to their bit significance (e.g., least significant to most significant) and corresponding voltages are provided at outputs 1006(31) through 1006(38) to summing node 1008. In some embodiments, switching network 102 is implemented as a CMOS voltage mode circuit 1036 to provide for low power dissipation and power consumption.

In some embodiments, switching network 102 includes bias resistors R39 and R40. Bias resistor R39 is coupled to voltage source VDDA on a first end and summing node 1008 on a second end. Bias resistor R40 is coupled to GNDA (e.g., direct current (DC) ground) on a first end and summing node 1008 on a second end. In some embodiments, the resistance of R39 is substantially equal to the resistance of R40. Bias resistors R39 and/or R40 set a bias voltage 1010 of analog output signal 106. In addition, an output impedance of analog output signal 106 is fixed by the combination of bias resistors R39/R40 and resistors 1023/1025.

Figure 11:
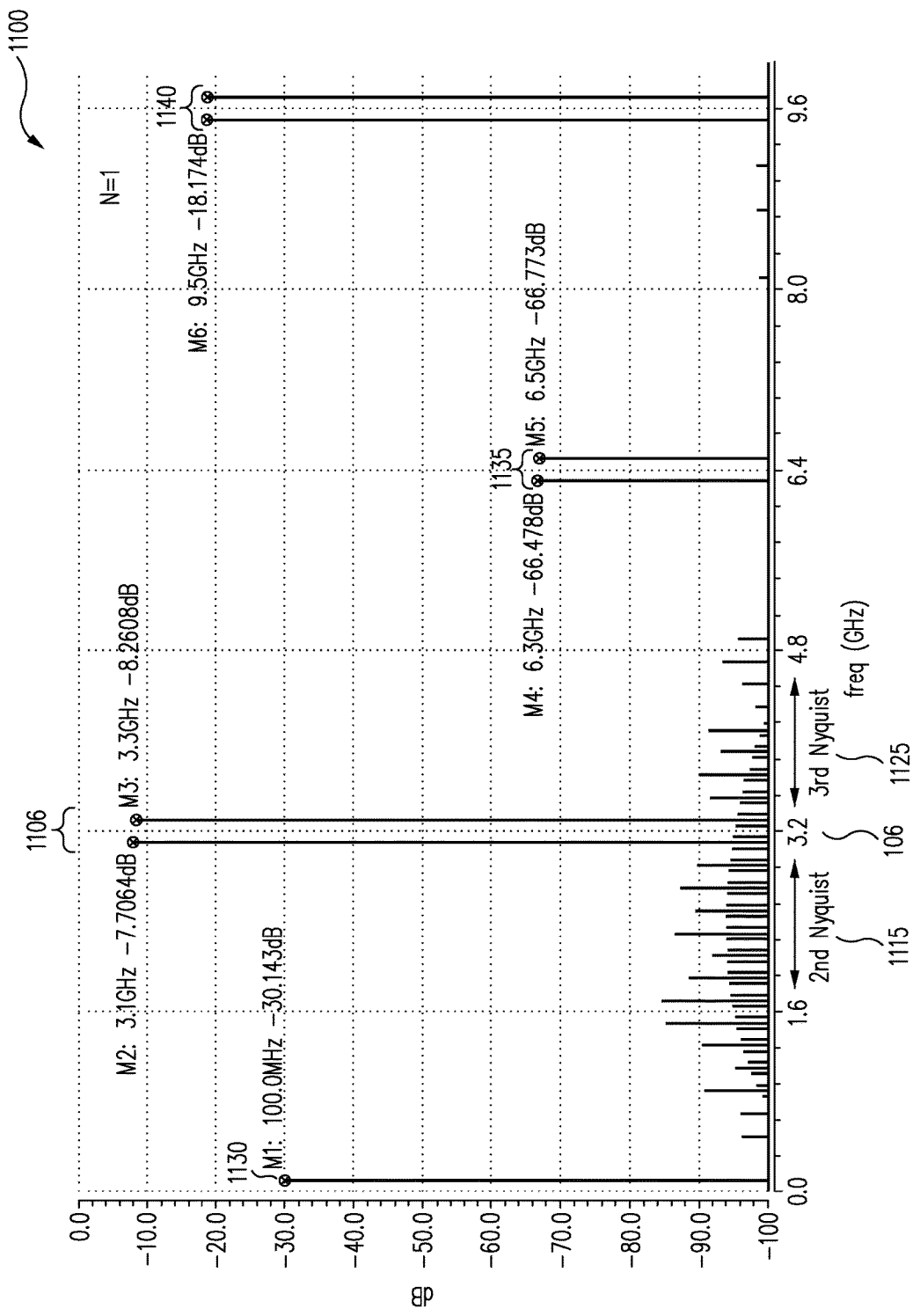
FIG. 11 illustrates a plot of signal energy versus frequency for a digital to analog upconverter in accordance with an embodiment of the disclosure.

FIG. 11 illustrates a plot 1100 of signal energy versus frequency for a digital to analog upconverter in accordance with an embodiment of the disclosure. Referring to FIG. 11, plot 1100 shows dominant spectral energy 1106 of analog output signal 106 centered at a frequency of approximately 3.2 GHz, between second Nyquist 1115 and third Nyquist 1125. In this example, the sampling frequency (Fs) used by the decoder circuit 130 is 3.2 GHz and digital data processed by the decoder circuit 130 has a frequency of 100 MHz (e.g., data signal frequency), as shown by signal 1130 on plot 1100. The mixer rate (NFs) is also 3.2 GHz and the digital mixer circuit 140 shifts more of the energy in the digital data to 3.1 GHz and 3.3 GHz (e.g., mixer rate +/− data signal frequency), as shown by signals 1106 on plot 1100. Harmonics having lower power occur at multiples of the mixer rate (e.g., 6.4 GHz and 9.6 GHz), as shown by signals 1135 and signals 1140 on plot 1100. The synchronization rate is 6.4 GHz and cannot be discerned in spectral energy plot 1100.

In view of the present disclosure, it will be appreciated that providing system 100 in accordance with various embodiments set forth herein may provide for adaptable and high speed digital to analog upconversion of a plurality of parallel digital data bits to an analog output voltage signal. In this regard, by performing an external to internal clock domain conversion, parallel data signals multiplexing, parallel digital data bit decoding, and parallel digital data bit frequency shifting operations of parallel data paths, and time alignment of the parallel digital data bits that become time misaligned with each other, all incorporated into voltage mode circuit topologies and single ended clock circuits configured for low power dissipation and consumption, an adaptable, high speed and high resolution digital to analog conversion may be implemented for satellite communications system.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A system (100) comprising:
   a decoder circuit (130) configured to receive a plurality of decoder input data bits (111c) and provide a plurality of decoded parallel digital data bits (111d), wherein the decoder circuit operates at a predefined sample rate (Fs);
   a mixer circuit (140) coupled to the decoder circuit and configured to combine each of the decoded parallel digital data bits with a conversion clock signal (145) to provide frequency shifted digital data bits (111e), wherein the frequency shifted digital data bits are time misaligned with each other due to time misalignment associated with logic state transitions of each of the decoded parallel digital data bits and logic state transitions of the conversion clock signal;
   a synchronizer circuit (105) coupled to the mixer circuit comprising a synchronizer clock signal (155) and configured to time align the frequency shifted digital data bits in response to the synchronizer clock signal; and
   a switching network (102) coupled to the synchronizer circuit and configured to generate an analog output signal (106) in response to time aligned frequency shifted digital data bits (112a).

2. The system of claim 1, wherein the mixer circuit is configured to translate the decoded parallel digital data bits at a first frequency (Fs) to the frequency shifted digital data bits at a second frequency (NFs), wherein the mixer circuit operates at a rate N times the predefined sample rate, and wherein the synchronizer circuit operates at a rate twice the mixer circuit rate.

3. The system of claim 1, wherein the analog output signal comprises a bandwidth (1130) corresponding to a bandwidth of the decoder input data bits, and wherein a dominant spectral energy (1106) of the analog output signal is centered around a frequency (NFs) of the conversion clock signal.

4. The system of claim 1, further comprising a multiplexer circuit (120) coupled to the decoder circuit and configured to receive a plurality of parallel digital data words (111b) in response to a multiplexer clock signal (125) and provide a corresponding one of the parallel digital data words (237) comprising the decoder input data bits at the predefined sample rate, wherein the multiplexer clock signal comprises a sample rate (Fs/M) 1/M times the predefined sample rate.

5. The system of claim 4, further comprising a mesochronous interface "MCI" circuit (110) coupled to the multiplexer circuit and configured to receive a plurality of MCI input data words (111a) from an external source and synchronized by an external clock signal (115), and provide the plurality of parallel digital data words synchronized by the multiplexer clock signal, wherein the external clock signal is asynchronous to the multiplexer clock signal.

6. The system of claim 1, wherein the mixer circuit is a first mixer circuit, the synchronizer circuit is a first synchronizer circuit, the switching network is a first switching network, and the analog output signal is a first analog output signal (106a), the system further comprising:
   a second mixer circuit (140b) coupled to the decoder circuit and configured to combine each of the decoded parallel digital data bits with the conversion clock signal to provide frequency shifted digital data bits, wherein the frequency shifted digital data bits are time misaligned with each other;
   a second synchronizer circuit (105b) coupled to the second mixer circuit comprising the synchronizer clock signal and configured to time align the frequency shifted digital data bits in response to the synchronizer clock signal;
   a second switching network (102b) coupled to the second synchronizer circuit and configured to generate a second analog output signal (106b) in response to time aligned frequency shifted digital data bits wherein the second analog output signal is a complementary signal of the first analog output signal; and
   wherein the decoder circuit, the first and second mixer circuit, the first and second synchronizer circuit, and the first and second switching network comprise single-ended complementary metal-oxide-semiconductor "CMOS" circuits (636, 836, 1036).

7. The system of claim 1, wherein the synchronizer clock signal is a single ended clock signal, the system further comprising a dual-edge detector circuit (180) configured to convert a differential clock signal (175) having a first frequency (NFs) to the single ended clock signal having a second frequency (2NFs) that is twice the first frequency.

8. The system of claim 1, wherein the switching network comprises a plurality of resistors (1023, 1025) arranged in a parallel configuration, wherein corresponding ones of the resistors are coupled to corresponding ones of the time aligned frequency shifted digital data bits, and wherein the switching network further comprises a summing node (1008) coupled to the analog output signal, wherein each of the resistors are selectively coupled to the summing node in response to the corresponding time aligned frequency shifted data bit.

9. The system of claim 8, wherein the switching network further comprises at least one bias resistor (R39) coupled to the summing node at a first end and a voltage source (VDDA) at a second end, wherein the at least one bias resistor sets a bias voltage (1010) of the analog output signal, and wherein the at least one bias resistor and the resistors combine to fix an output impedance of the analog output signal.

10. A method comprising:
  receiving (325), by a decoder circuit (130), a plurality of decoder input data bits (111*c*);
  providing (325, 330), by the decoder circuit, a plurality of decoded parallel digital data bits (111*d*), wherein the decoder circuit operates at a predefined sample rate (Fs);
  combining (335), by a mixer circuit (140) coupled to the decoder circuit, each of the decoded parallel digital data bits with a conversion clock signal (145) to provide frequency shifted digital data bits (111*e*), wherein the frequency shifted digital data bits are time misaligned with each other due to time misalignment associated with logic state transitions of each of the decoded parallel digital data bits and logic state transitions of the conversion clock signal;
  aligning (340), by a synchronizer circuit (105) coupled to the mixer circuit, the frequency shifted digital data bits in response to a synchronizer clock signal (155); and
  generating (345), by a switching network (102) coupled to the synchronizer circuit, an analog output signal (106) in response to time aligned frequency shifted digital data bits (112*a*).

11. The method of claim 10, further comprising:
  translating (335), by the mixer circuit, the decoded parallel digital data bits at a first frequency (Fs) to the frequency shifted digital data bits at a second frequency (NFs);
  operating (335) the mixer circuit at a rate (NFs) N times the predefined sample rate; and
  operating (340) the synchronizer circuit at a rate (2NFs) twice the mixer rate.

12. The method of claim 10, wherein the analog output signal comprises a bandwidth (1130) corresponding to a bandwidth of the decoder input data bits, and wherein a dominant spectral energy (1106) of the analog output signal is centered around a frequency (NFs) of the conversion clock signal.

13. The method of claim 10, further comprising:
  receiving (320), by a multiplexer circuit (120) coupled to the decoder circuit, a plurality of parallel digital data words (111*b*) in response to a multiplexer clock signal (125); and
  providing (320), by the multiplexer circuit, a corresponding one of the parallel digital data words (237) comprising the decoder input data bits at the predefined sample rate,
  wherein the multiplexer clock signal comprises a sample rate (FS/M) 1/M times the predefined sample rate.

14. The method of claim 13, further comprising:
  receiving (310), by a mesochronous interface "MCI" circuit (110) coupled to the multiplexer circuit, a plurality of MCI input data words (111*a*) synchronized by an external clock signal (115); and
  providing (315), by the MCI circuit, the plurality of parallel digital data words synchronized by the multiplexer clock signal,
  wherein the external clock signal is asynchronous to the multiplexer clock signal.

15. The method of claim 10, wherein the mixer circuit is a first mixer circuit, the synchronizer circuit is a first synchronizer circuit, the switching network is a first switching network, and the analog output signal is a first analog output signal (106*a*), the method further comprising:
  combining, by a second mixer circuit (140*b*) coupled to the decoder circuit, each of the decoded parallel digital data bits with the conversion clock signal to provide frequency shifted digital data bits, wherein the frequency shifted digital data bits are time misaligned with each other;
  aligning, by a second synchronizer circuit (105*b*) coupled to the second mixer circuit, the frequency shifted digital data bits in response to the synchronizer clock signal; and
  generating, by a second switching network (102*b*) coupled to the second synchronizer circuit, a second analog output signal (106*b*) in response to time aligned frequency shifted digital data bits wherein the second analog output signal is a complementary signal of the first analog output signal; and
  wherein the decoder circuit, the first and second mixer circuits, the first and second synchronizer circuits, and the first and second switching networks comprise single-ended complementary metal-oxide-semiconductor "CMOS" circuits (636, 836, 1036).

16. The method of claim 10, wherein the synchronizer clock signal is a single ended clock signal, the method further comprising converting (305), by a dual-edge detector circuit (180), a differential clock signal (175) having a first frequency (NFs) to the single ended clock signal having a second frequency (2NFs) that is twice the first frequency.

17. The method of claim 10, wherein the switching network comprises a plurality of resistors (1023, 1025) arranged in a parallel configuration, wherein corresponding ones of the resistors are coupled to corresponding ones of the time aligned frequency shifted digital data bits, and wherein the switching network further comprises a summing node (1008) coupled to the analog output signal, the method further comprising selectively coupling each of the resistors to the summing node in response to the corresponding time aligned frequency shifted data bit.

18. The method of claim 17, wherein the switching network further comprises at least one bias resistor (R39) coupled to the summing node at a first end and a voltage source (VDDA) at a second end, wherein the at least one bias resistor sets a bias voltage (1010) of the analog output signal, and wherein the at least one bias resistor and the resistors combine to fix an output impedance of the analog output signal.

* * * * *